United States Patent
Park et al.

(10) Patent No.: US 10,804,924 B2
(45) Date of Patent: Oct. 13, 2020

(54) SYSTEMS FOR REDUCING PATTERN-DEPENDENT INTER-SYMBOL INTERFERENCE AND RELATED METHODS

(71) Applicant: MEDIATEK Singapore Pte. Ltd., Singapore (SG)

(72) Inventors: Henry Arnold Park, San Jose, CA (US); Tamer Mohammed Ali, San Jose, CA (US)

(73) Assignee: MEDIA TEK Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/579,456

(22) Filed: Sep. 23, 2019

(65) Prior Publication Data
US 2020/0244280 A1   Jul. 30, 2020

Related U.S. Application Data

(60) Provisional application No. 62/796,204, filed on Jan. 24, 2019.

(51) Int. Cl.
*H03M 1/74* (2006.01)
*H03M 1/12* (2006.01)
(Continued)

(52) U.S. Cl.
CPC ........ *H03M 1/74* (2013.01); *H03K 19/00346* (2013.01); *H03K 19/018521* (2013.01); *H03M 1/1205* (2013.01); *H03M 1/1295* (2013.01)

(58) Field of Classification Search
CPC .... H03M 1/74; H03M 1/1295; H03M 1/1205; H03K 19/00346; H03K 19/018521
(Continued)

(56) References Cited

U.S. PATENT DOCUMENTS 6,484,268 B2   11/2002   Tamura et al.
7,148,725 B1   12/2006   Chan et al.
(Continued)

FOREIGN PATENT DOCUMENTS

CN   101674073 A   3/2010
GB   2 381 882 A   5/2003

OTHER PUBLICATIONS

Extended European Search Report dated Apr. 22, 2020 in connection with European Application No. 20150708.4.
(Continued)

*Primary Examiner* — Khai M Nguyen
(74) *Attorney, Agent, or Firm* — Wolf, Greenfield & Sacks, P.C.

(57) ABSTRACT

System for reducing pattern-dependent inter-symbol interference (ISI) are described. These systems may be implemented using complementary metal-oxide-semiconductor (CMOS) transistors. These systems are designed to clamp the voltage propagating along the datapath to a value that is a fraction of the supply voltage. Furthermore, these systems are designed to reduce the time constant of the datapath. One such system comprises a source including a digital-to-analog converter (DAC) and a destination comprising an analog-to-digital converter (ADC). A circuit disposed along the data path from the DAC to the ADC is configured to receive a supply voltage, receive an input signal from the DAC, and produce an output signal based on the input signal by clamping the output signal to a voltage that is a fraction of the supply voltage.

20 Claims, 13 Drawing Sheets

(51) Int. Cl.
*H03K 19/0185* (2006.01)
*H03K 19/003* (2006.01)

(58) Field of Classification Search
USPC .................................. 341/126; 375/226, 229
See application file for complete search history.

(56) References Cited

U.S. PATENT DOCUMENTS

| | | |
|---|---|---|
| 9,148,146 B1 | 9/2015 | Faucher et al. |
| 10,187,230 B1 * | 1/2019 | Abdelhalim ........ H04L 25/0328 |
| 2006/0244479 A1 | 11/2006 | Major |
| 2012/0146686 A1 | 6/2012 | Maarouf |

OTHER PUBLICATIONS

Dave et al., A variation tolerant current-mode signaling scheme for on-chip interconnects. IEEE Transactions on Very Large Scale Integration (VLSI) Systems. Feb. 2013;21(2):342-53.
Menolfi et al., A 112Gb/s 2.6 pJ/b 8-Tap FFE PAM-4 SST TX in 14nm CMOS, 2018 IEEE International Solid-State Circuits Conference, pp. 104-105.
Shibasaki et al., A 56Gb/s NRZ-Electrical 247mW/lane Serial-Link Transceiver in 28nm CMOS, 2016 IEEE International Solid-State Circuits Conference, 64-65.
EP 20150708.4, Apr. 22, 2020, Extended European Search Report.

* cited by examiner

FIG. 8 the

SYSTEMS FOR REDUCING PATTERN-DEPENDENT INTER-SYMBOL INTERFERENCE AND RELATED METHODS

CROSS REFERENCE TO RELATED APPLICATIONS

This Application claims priority under 35 U.S.C. § 119(e) to U.S. Provisional Application Ser. No. 62/796,204, entitled "HIGH-PERFORMANCE DATAPATH WITH ADJUSTABLE BANDWIDTH EXTENSION" filed on Jan. 24, 2019, which is herein incorporated by reference in its entirety.

TECHNICAL FIELD

The present application relates to systems and methods for reducing pattern-dependent inter-symbol interference in electronic circuits.

BACKGROUND

In telecommunications, inter-symbol interference (ISI) occurs when one symbol interferes with a subsequent or a previous symbol. This is an unwanted phenomenon as it leads to noise, thus making the communication less reliable. ISI is usually caused by multipath propagation or the inherent linear or non-linear frequency response of a communication channel causing successive symbols to mix together.

BRIEF SUMMARY

Some embodiments relate to a system for reducing pattern-dependent inter-symbol interference (ISI). The system comprises a chip comprising a source including a multiplexer; a destination comprising an digital-to-analog converter (DAC); and a circuit disposed along a data path from the multiplexer to the DAC. The circuit is configured to receive a supply voltage; receive an input signal from the DAC, and produce an output signal based on the input signal, wherein producing the output signal comprises clamping the output signal to a voltage that is a fraction of the supply voltage.

The circuit may be further configured to decrease a transition time of the output signal from a first value to the voltage by introducing a parallel resistance along the data path during at least a portion of the transition time.

The source may be configured to transmit data to the destination at a data rate greater than 56 Gb/s.

The circuit may comprise a feedback equalizer.

The feedback equalizer may comprise first and second open-loop buffers and first and second feedback buffers, the first feedback buffer being coupled between an input of the first open-loop buffer and an output of the second open-loop buffer and second feedback buffer being coupled between an input of the second open-loop buffer and an output of the first open-loop buffer.

The first feedback buffer may comprise a header transistor, a footer transistor, and an inverter disposed between the header transistor and the footer transistor.

The circuit may comprise a shunt device.

The shunt device may comprise first and second buffers and one or more transistors connecting an output of the first buffer to an output of the second buffer.

The circuit may comprise one or more complementary metal-oxide-semiconductor (CMOS) transistors.

Some embodiments relate to a circuit disposed along a data path between a source to a destination The circuit comprises one or more complementary metal-oxide-semiconductor (CMOS) transistors. The circuit is configured to receive a supply voltage; receive an input signal from the source, and produce an output signal based on the input signal, wherein producing the output signal comprises clamping the output signal to a voltage that is a fraction of the supply voltage.

The circuit may comprise a feedback equalizer comprising the one or more CMOS transistors.

The feedback equalizer may comprise first and second open-loop buffers and first and second feedback buffers, the first feedback buffer being coupled between an input of the first open-loop buffer and an output of the second open-loop buffer and second feedback buffer being coupled between an input of the second open-loop buffer and an output of the first open-loop buffer.

The first feedback buffer may comprise a header transistor, a footer transistor, and a CMOS inverter disposed between the header transistor and the footer transistor.

The circuit may comprise a shunt device.

The shunt device may comprise first and second buffers and the one or more CMOS transistors connect an output of the first buffer to an output of the second buffer.

Some embodiments relate to a method comprising transmitting an input signal from a source to a destination with a data rate greater than 56 Gb/s; and enabling transmission of the input signal from the source to the destination with a circuit disposed between the source and the destination. The enabling comprises receiving a supply voltage; receiving the input signal from the source; and producing an output signal based on the input signal, wherein producing the output signal comprises clamping the output signal to a voltage that is a fraction of the supply voltage.

The method may further comprise decreasing a transition time of the input signal from a first value to the voltage by introducing a parallel resistance along a data path positioned between the source and the destination during at least a portion of the transition time.

Introducing a parallel resistance along the data path may comprise allowing a complementary metal-oxide-semiconductor (CMOS) inverter to transition from a first state to a second state.

The fraction may be between 0.5 and 1.

The source and the destination may be on a same chip.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

New communication standards have emerged in the recent years which are expected to be deployed in cloud-based infrastructures including data centers. One such standard is the "112G," in which data are transferred at 112 Gb/s, and which is expected to replace at least in some applications the "56G" standard. By increasing the speed at which data are transferred, these new communication standards will improve the overall capacity of the internet, and will be a key enabler of new applications such as the Internet-of-Things. Other standards operating at data rates greater than 56 Gb/s (other than 112 Gb/s) may emerge in the future.

The inventors have appreciated, however, that increasing the speed at which data are transferred leads to a variety of drawbacks. One such drawback is pattern-dependent inter-symbol interference (ISI). Consider for example the chip of FIG. 1A, which includes a source 102, a data path 103 and a destination 108. Source 102 is configured to transmit digital data to destination 108 with a high data rate, for example according to the 112G standard or according to any other standard with data rates in excess of 56 Gb/s.

Figure 1A:
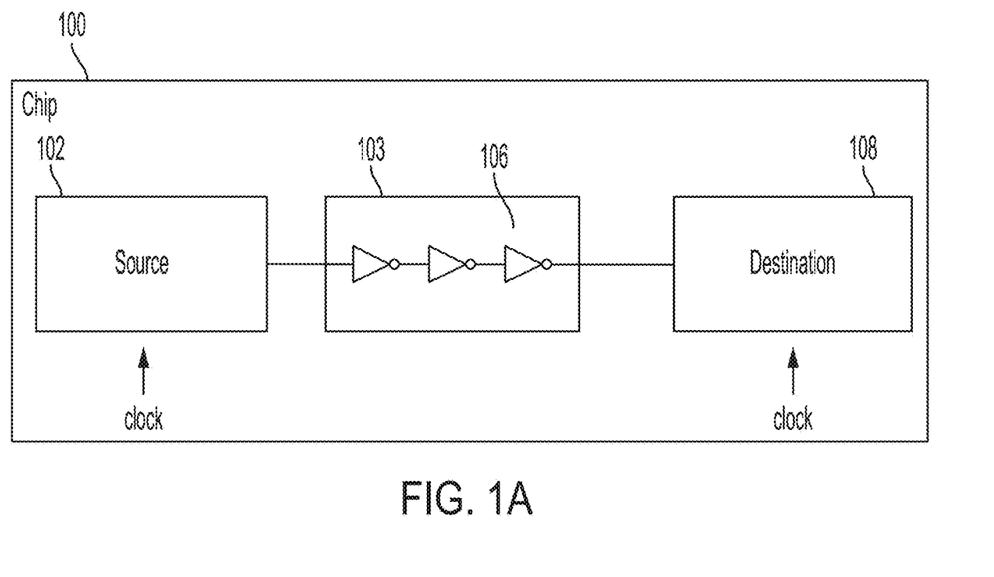
FIG. 1A is a block diagram illustrating an electronic communication link.

Source 102 may include various electronic circuits, including for example flip-flops, multiplexers and retimers, among other examples. Destination 108 may include various electronic circuits, including for example flip-flops, multiplexers and digital-to-analog converters (DACs). Data path 103 may be a differential channel, in that it may include a pair of lines. Each line of the pair includes multiple inverters 106, which are configured to facilitate transmission of the signal down the line.

Data path 103 inevitably exhibits parasitics, such as parasitic capacitances and parasitic resistances, arising for example in the conductive traces and the inverters. At relatively low speeds, such as 56 Gb/s or lower, the presence of these parasitics may affect the integrity of the signals propagating down the channel, but this effect is negligible, at least in some circumstances. At higher data rates, however, the impact of these parasitics on the integrity of the signals is more serious. In some circumstances, the degree to which the parasitics affect the signals may depend upon the signal pattern.

Figure 1B:
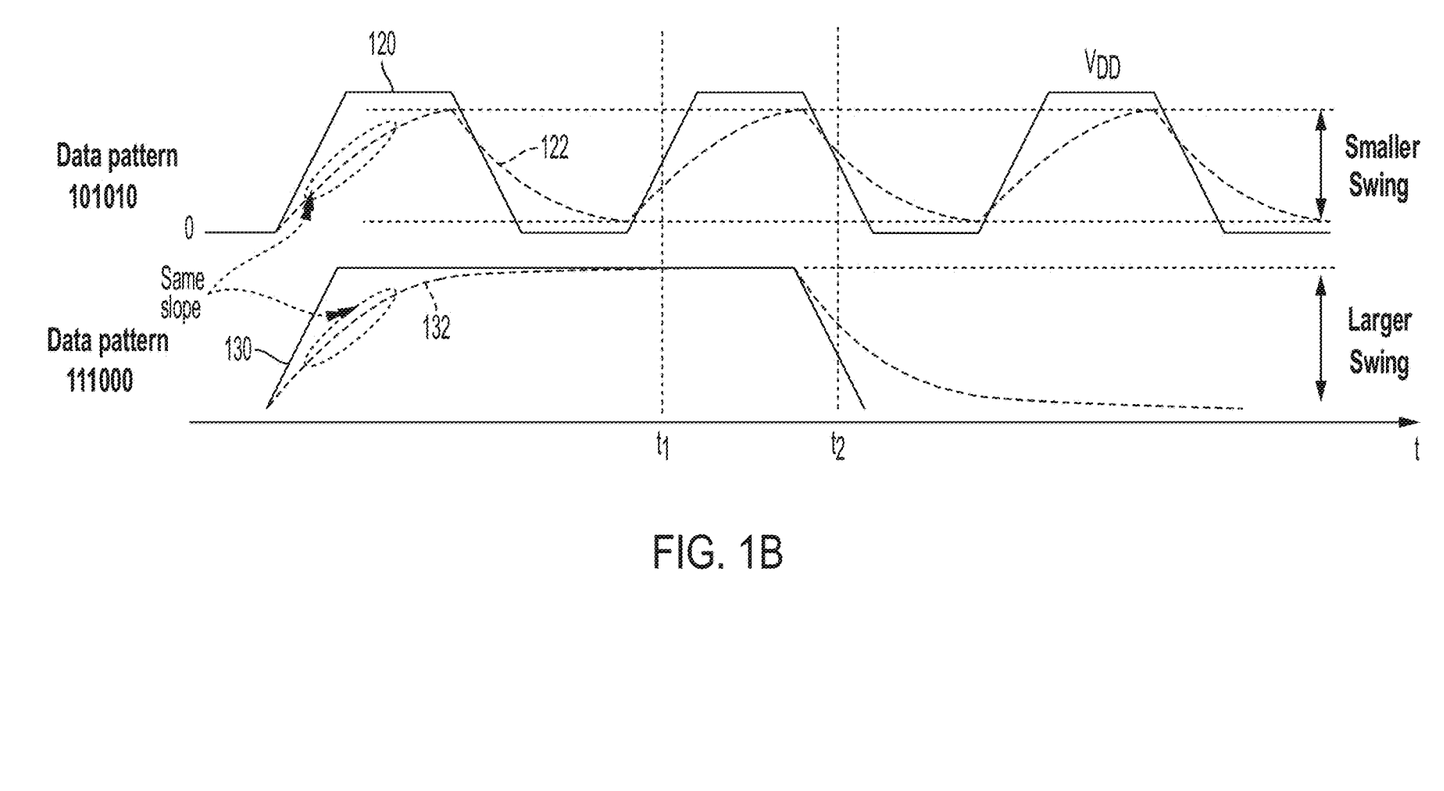
FIG. 1B is a plot illustrating two example responses of the electronic communication link of FIG. 1A.

In FIG. 1B, the bottom plot illustrates the response of the link of FIG. 1A when the signal exhibits a slow pattern (in this case, 111000111000 . . . ) and the top plot illustrates the response when the signal exhibits a fast pattern (in this case, 10101010 . . . ). The terms "fast" and "slow" denote the frequency with which 1 and 0 alternate in a bit sequence.

Referring first to the top plot, signal 120 represents the waveform emerging from source 102, which toggles between the voltage rails 0 and $V_{DD}$. Signal 122 represents the waveform at some location downstream from source 102 along data path 103. Due to the presence of parasitics, the slope of signal 122 is not sufficiently high to permit signal 122 to reach the voltage rails. Referring for example to the time interval between $t_1$ and $t_2$, signal 122 increases in response to signal 120 toggling from 0 to $V_{DD}$. However, signal 120 toggles back to 0 before signal 122 has had sufficient time to reach $V_{DD}$. This is because the parasitics of the communication channel increase the time constant at which signal 122 is able to vary over time, thereby reducing its slope. Similarly, signal 120 toggles back to $V_{DD}$ before signal 122 has had sufficient time to reach 0. The result is that the voltage rails of signal 122 are squeezed. Signal 122 swings between a value greater than 0 and a fraction of $V_{DD}$.

Referring now to the bottom plot, signal 130 represents the waveform emerging from source 102, which toggles between the voltage rails 0 and $V_{DD}$. Signal 132 represents the waveform at some location downstream from source 102 along communication channel 103. Due to the parasitics of communication channel, the slope of signal 132 is the same as the slope of signal 122. Unlike signal 122, however, signal 132 does have sufficient time to reach the voltage rails 0 and $V_{DD}$. This is because the signal pattern is slower, meaning that signal 130 stays at the voltage rails for longer periods relative to signal 120. Thus, signal 132 swings between 0 and $V_{DD}$.

Therefore, signals traveling down communication channel 103 toggle between different values depending upon the pattern with which they are modulated. Patterns vary over time depending on the information being transmitted, meaning that the voltage rails of the traveling signals are continuously changing. The effect of this behavior is illustrated in the eye diagram of FIG. 1C, a chart commonly used as an indicator of the quality of signals in high-speed digital transmissions. Eye diagrams are generated using oscilloscopes by overlaying sweeps of different segments of a long data stream. In an ideal world, eye diagrams have the shape of rectangular waveforms. In reality, the transitions do not line perfectly on top of each other, and an eye-shaped pattern results.

Figure 1C:
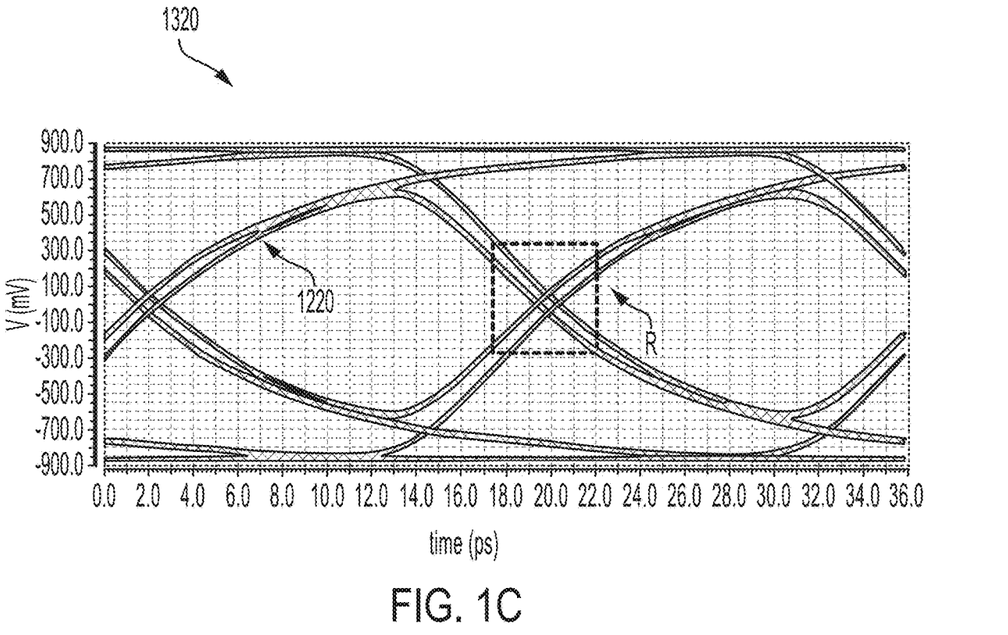
FIG. 1C is an eye diagram associated with the electronic communication link of FIG. 1A.

Numeral 1320 represents the trajectory of signal 132 (associated with the slow pattern 111000111000 . . . ) and numeral 1220 represent the trajectory of signal 122 (associated with the fast pattern 10101010 . . . ). The vertical opening of the eye diagram is a qualitative measure of the integrity of the signal. Signal's 122 inability to reach the voltage rails 0 and $V_{DD}$ results in an eye diagram that is partially closed.

Figure 1D:
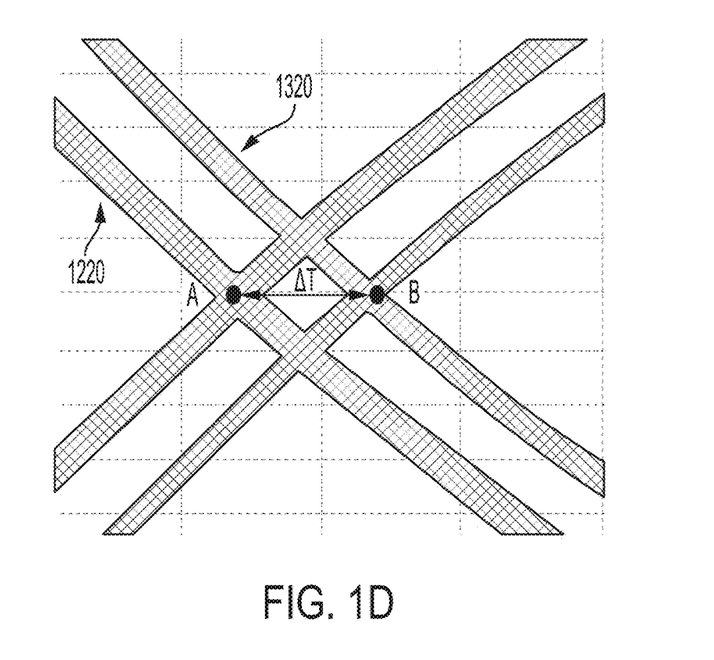
FIG. 1D illustrates a portion of the eye diagram of FIG. 1C in additional detail.

Region R of the eye diagram is illustrated in FIG. 1D in additional detail. As shown in FIG. 1D, the signals associated with numerals 1220 and 1320 have different trajectories. The result is that instead of having a single point where the rising edge meets the falling edge, there are two points: A and B. The separation between A and B along the time axis is referred to as ISI. ISI can lead to bit decision errors. More specifically, the larger the ISI, the larger the bit error rate (BER). Large BERs lead to loss of signal integrity.

The inventors have appreciated that pattern-dependent ISI—and as a result BER—in high data rate communication links can be reduced by clamping the signal traveling down the communication channel to a pair of voltage rails that are inside the voltage rails of the signal generated by the transmitter. In some embodiments, for example, the signal may be clamped to a voltage equal to $(1-\beta)V_{DD}$ and to a voltage equal to $\beta V_{DD}$, where $\beta$ is less than 1 (e.g., between 0.5 and 1). The value of $\beta$ should be chosen, at least in some embodiments, so that the signal is able to reach the clamped voltage rails before toggling back to the previous value for any signal pattern.

Figure 2:
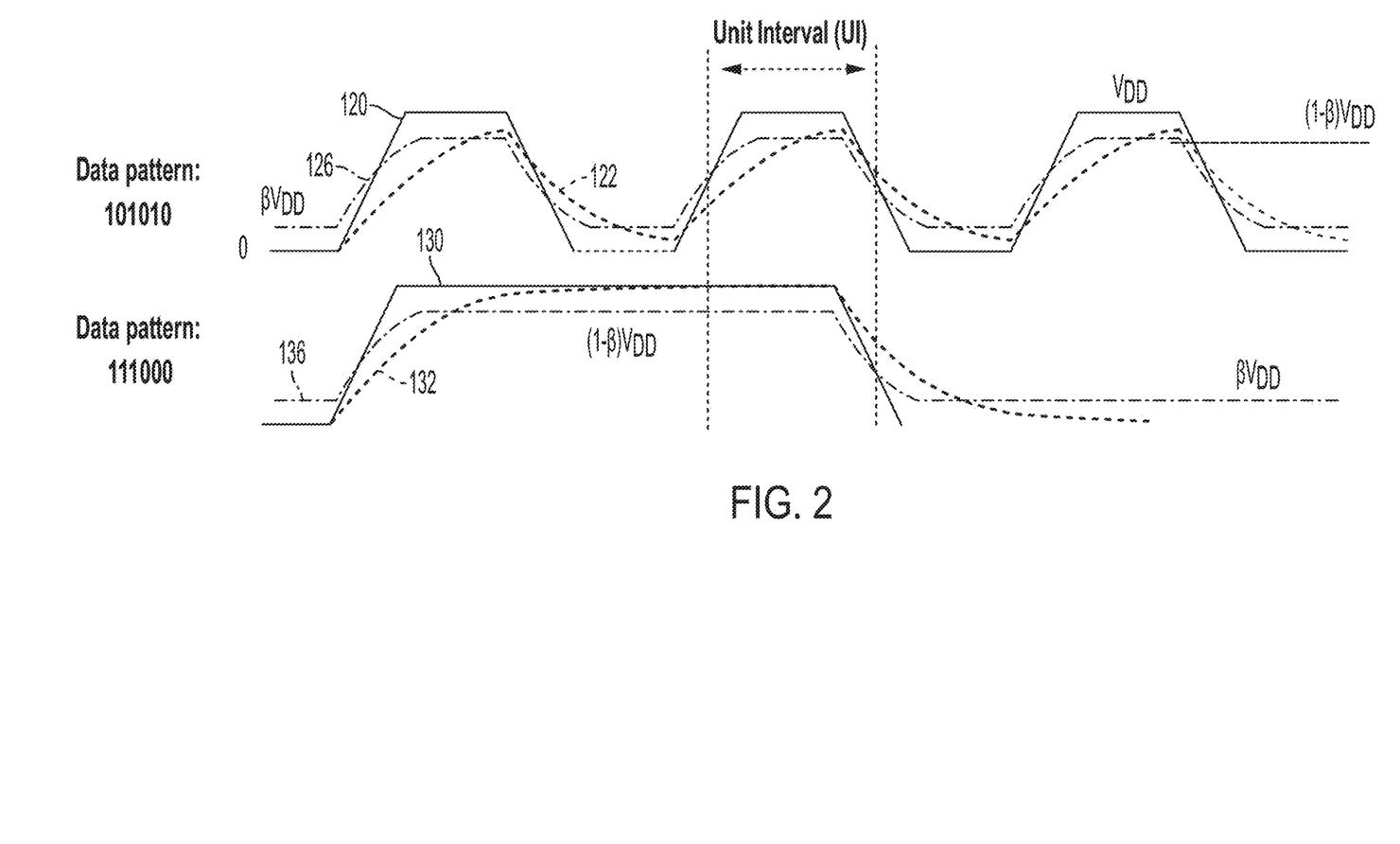
FIG. 2 is a plot illustrating a technique for reducing pattern-dependent inter-symbol interference, in accordance with some embodiments.

Consider for example the plot of FIG. 2, illustrating an example of how signal clamping may be performed, in accordance with some embodiments. Again, the top plot corresponds to a fast pattern 10101010 . . . and the bottom plot corresponds to a slow pattern 111000111000 . . . .

Referring first to the top plot, signal 120 represents again the waveform emerging from source 102, which toggles between the voltage rails 0 and $V_{DD}$. Signal 122 represents the waveform at some location downstream from source 102 along communication channel 103 absent the voltage clamping. Signal 126 represents the waveform at the same downstream location but when voltage clamping is applied. When signal 126 reaches $(1-\beta)V_{DD}$, instead of continuing to increase as does signal 122, it remains clamped to $(1-\beta)V_{DD}$ until the subsequent falling edge. Similarly, when signal 126 reaches $\beta V_{DD}$, instead of continuing to decrease as does signal 122, it remains clamped to $\beta V_{DD}$ until the subsequent rising edge.

Referring now to the bottom plot, signal 130 represents again the waveform emerging from source 102, which toggles between the voltage rails 0 and $V_{DD}$. Signal 132 represents the waveform at some location downstream from source 102 along data path 103 absent the voltage clamping. Signal 136 represents the waveform at the same downstream location but when voltage clamping is applied. As in the previous case, signal 136 is clamped to $(1-\beta)V_{DD}$ before it can reach $V_{DD}$, and is clamped to $\beta V_{DD}$ before it can reach 0.

The result is that the signal is clamped to the same voltage rails—$\beta V_{DD}$ and $(1-\beta)V_{DD}$—regardless of the signal pattern. This is turn, reduces pattern-dependent ISI and BER.

Figure 3A:
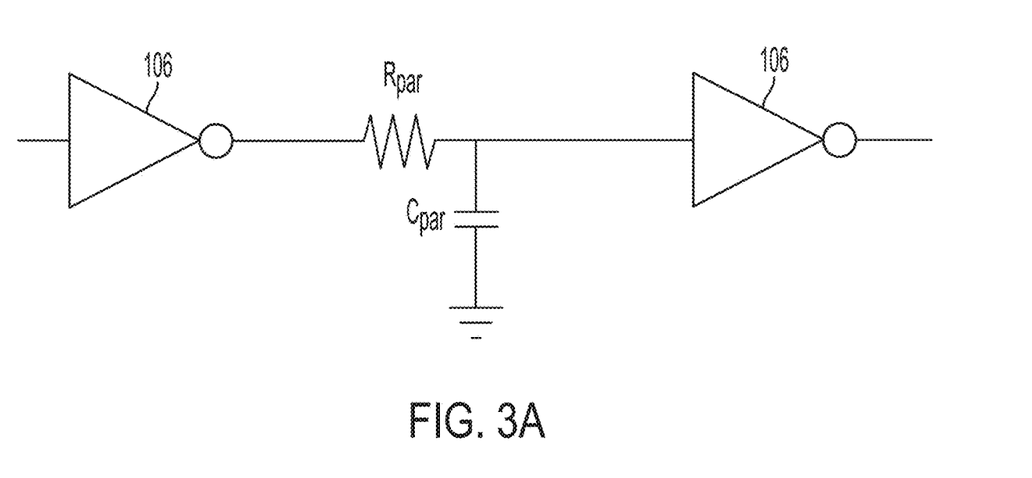
FIG. 3A is a circuit diagram illustrating a pair of inverters.

The inventors have appreciated that ISI may be further reduced by decreasing the time constant of the signal, thus increasing its slope and reducing the time with which the signal reaches the clamped voltage rail. Such a reduction in the time constant of the signal may be achieved by introducing a parallel resistance along the data path from source 102 to destination 108. FIG. 3A is a circuit diagram illustrating a pair of adjacent inverters 106 that are part of a data path 103. Resistance $R_{par}$ represents the parasitic resistance of the line and $C_{par}$ represents the parasitic capacitance of the line. In this example, the time constant with which the signal transitions from one value to another is given by the product of $R_{par}$ and $C_{par}$ (i.e., $R_{par}C_{par}$).

Figure 3B:
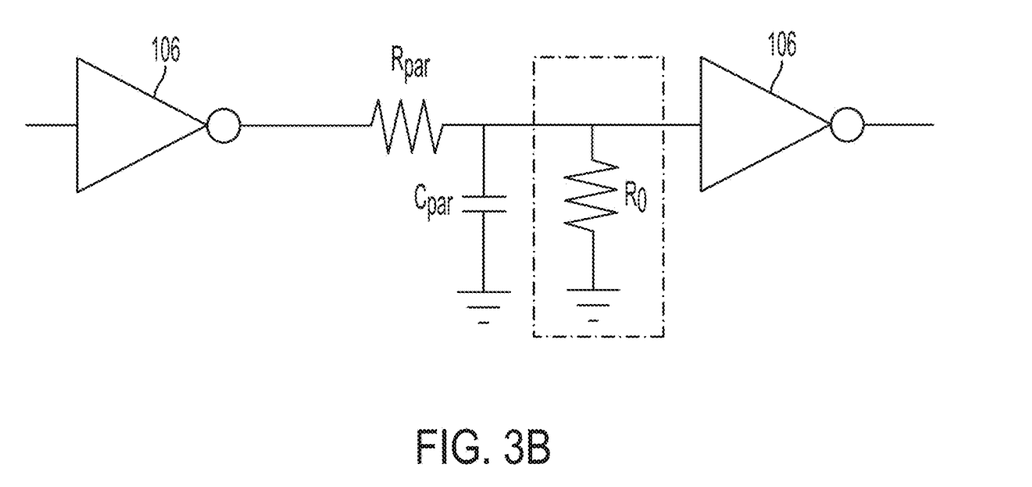
FIG. 3B is a circuit diagram illustrating a pair of inverters and a parallel resistance, in accordance with some embodiments.

In some embodiments, the time constant may be reduced by reducing this product, which may be achieved by reducing $R_{par}$ and/or $C_{par}$. In the example of FIG. 3B, a parallel resistance $R_0$ is introduced along the line. Being placed in parallel, this resistance leads to a time constant of $C_{par}(R_0//R_{par})$ that is less than $R_{par}C_{par}$. It should be appreciated that, in differential implementations, resistor $R_0$ may be placed with one terminal coupled to one line of the pair and the other terminal coupled to the other line of the pair.

Notwithstanding the foregoing appreciation, the inventors have recognized that placing resistors along a data path may be impractical, as resistors are costly and difficult to implement in large scales.

Recognizing this challenge, the inventors have developed circuits for introducing parallel resistances as shown in FIG. 3B using complementary metal-oxide-semiconductor (CMOS) chips. CMOS chips of the types described herein are chips that include at least one p-MOS transistor and/or at least one n-MOS transistor.

Figure 4A:
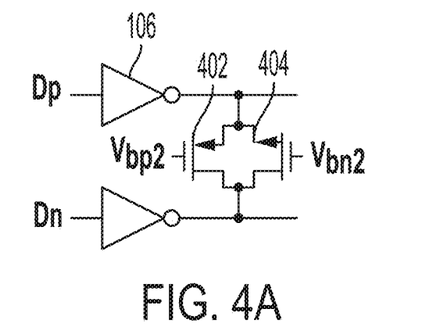
FIG. 4A is a circuit diagram illustrating an example circuit for reducing pattern-dependent inter-symbol interference, in accordance with some embodiments.

FIG. 4A is an example of such a circuit, in accordance with some embodiments. In this example, transistors 402 and 404 collectively form a shunt device. Being a differential communication channel, in this example the shunt device is coupled between the lines of the differential pair. Further, in this example, transistor 402 is implemented as a p-MOS transistor and transistor 404 is implemented as a n-MOS transistor. The drain of each transistor is coupled to the source of the other transistor. In some embodiments, the voltages with which the gates of the transistors are biased—$V_{bp2}$ and $V_{bn2}$—may be chosen to set the clamped voltage rail to a desired value. For example, the bias gate voltages may be chosen so that the clamped voltage rails are $0.2V_{DD}$ and $0.8V_{DD}$, respectively.

Figure 4B:
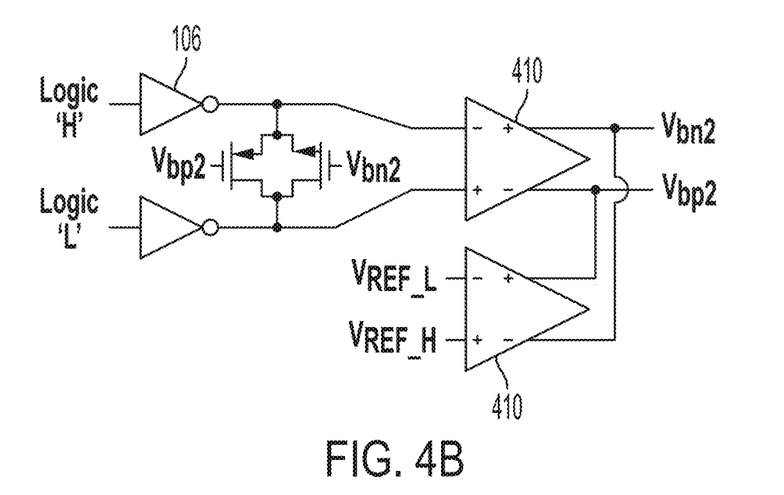
FIG. 4B is a circuit diagram illustrating an example of a bias circuit, in accordance with some embodiments.

The bias circuit of FIG. 4B may be used to set $V_{bp2}$ and $V_{bn2}$. The bias circuit includes a pair of inverters that are substantially the same as the inverters of FIG. 4A and a pair of transistors that are substantially the same as transistors 402 and 404. The inverters and the transistors are arranged in the same manner as in FIG. 4A. In addition, the bias circuit includes a pair of comparators 410 having outputs in parallel with each other. The outputs of the comparators are provided at the gates of transistors 402 and 404. In some embodiments, the desired clamped voltage rails $V_{REF\_H}$ and $V_{REF\_L}$ are provided as inputs to one of the comparators. For instance, assuming that the user desires to set the clamped voltage rails to $0.2V_{DD}$ and $0.8V_{DD}$, such voltages are provided as input to the comparator. Because the inverters and the transistors of the bias circuit mirror those of the circuit of FIG. 4A, the outputs of the bias circuit are such that, if provided at the gates of transistors 402 and 404, the differential lines of FIG. 4A are clamped to $0.2V_{DD}$ and $0.8V_{DD}$.

While FIGS. 4A-4B illustrate inverters, non-inverting buffers may be used in other embodiments.

Figure 5A:
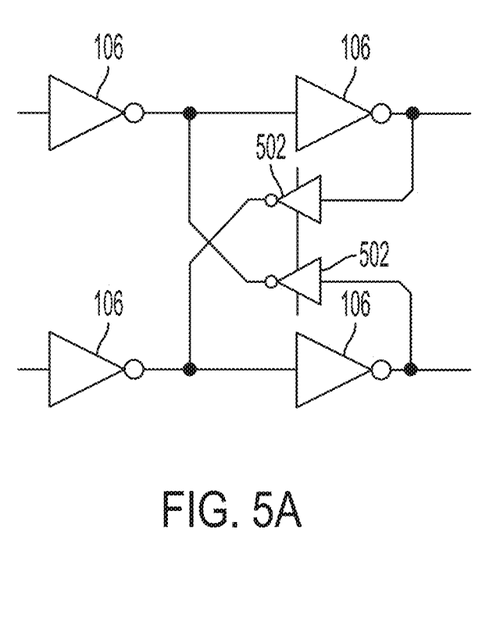
FIG. 5A is a circuit diagram illustrating another example circuit for reducing pattern-dependent inter-symbol interference, in accordance with some embodiments.

FIG. 5A illustrates another circuit for reducing the time constant of the communication channel, in accordance with some embodiments. This circuit includes open-loop buffers (e.g., inverters) 106, and feedback equalizers 502. Each feedback equalizer has an input coupled to a line of the differential pair and an output coupled to the other line of the differential pair, thus providing a feedback between the lines.

Figure 5B:
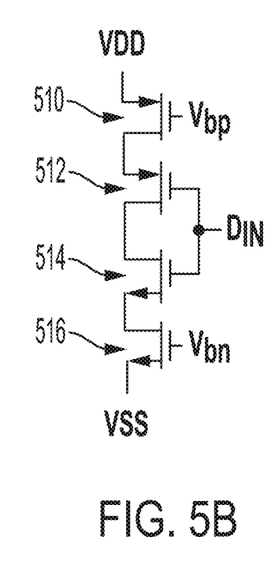
FIG. 5B is a circuit diagram illustrating an example inverter that may be used in connection with the circuit of FIG. 5A, in accordance with some embodiments.

In some embodiments, feedback equalizers 502 are implemented in the manner illustrated in FIG. 5B. In this example, a feedback equalizer includes transistors 510, 512, 514 and 516. Transistors 510 and 512 are p-MOS and transistors 514 and 516 are n-MOS.

Transistors 512 and 514 form a CMOS inverter. Transistor 510 is a header transistor, in that it is coupled between the CMOS inverter and $V_{DD}$. Transistor 516 is a footer transistor, in that it is coupled between the CMOS inverter and $V_{SS}$ (where in some embodiments, $V_{SS}=0$). In some embodiments, the voltages with which the gates of transistors 510 and 516 are biased—$V_{bp}$ and $V_{bn}$—may be chosen to set the clamped voltage rail to a desired value. For example, the bias gate voltages may be chosen so that the clamped voltage rails are $0.2V_{DD}$ and $0.8V_{DD}$, respectively.

Figure 5C:
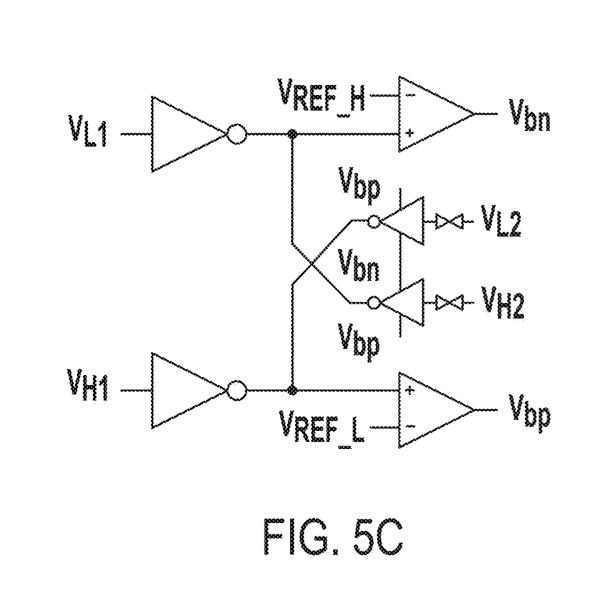
FIG. 5C is a circuit diagram illustrating another bias circuit, in accordance with some embodiments.

The bias circuit of FIG. 5C may be used to set $V_{bp}$ and $V_{bn}$. The bias circuit includes the same open-loop buffers and feedback equalizers as the circuit of FIG. 5A, thereby mirroring its behavior. In some embodiments, the desired clamped voltage rails $V_{REF\_H}$ and $V_{REF\_L}$ are provided as inputs to one of the comparators. For instance, assuming that the user desires to set the clamped voltage rails to $0.2V_{DD}$ and $0.8V_{DD}$, such voltages are provided as input to the comparator. Because the inverters and the transistors of the bias circuit mirror those of the circuit of FIG. 5A, the outputs of the bias circuit are such that, if provided at the gates of transistors 510 and 516, the differential lines of FIG. 5A are clamped to $0.2V_{DD}$ and $0.8V_{DD}$. In some embodiments, $V_{L1}$ is different from $V_{L2}$ and $V_{H1}$ is different from $V_{H2}$. In one specific example, $V_{L1}=0$, $V_{H1}=V_{DD}$, $V_{L2}=\beta V_{DD}$ and $V_{H2}=(1-\beta)V_{DD}$, though other values are also possible.

Figure 6A:
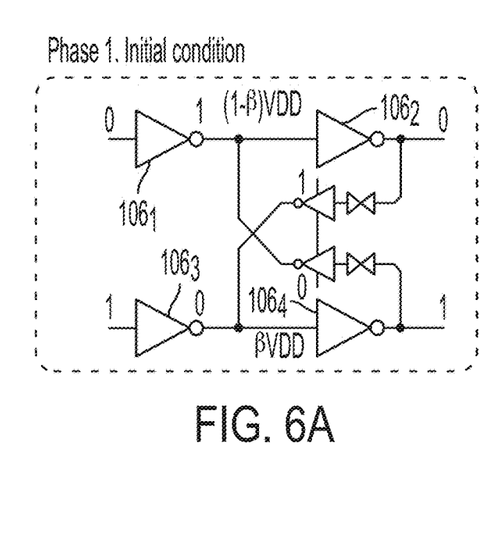
FIGS. 6A-6C are circuit diagrams illustrating the circuit of FIG. 6A as it transitions through different operational phases, in accordance with some embodiments.
Figure 6B:
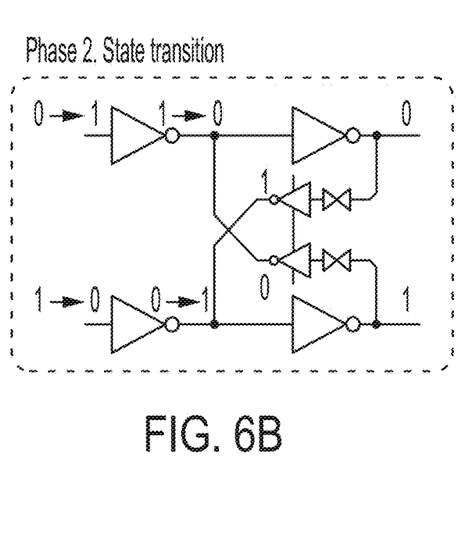
Figure 6C:
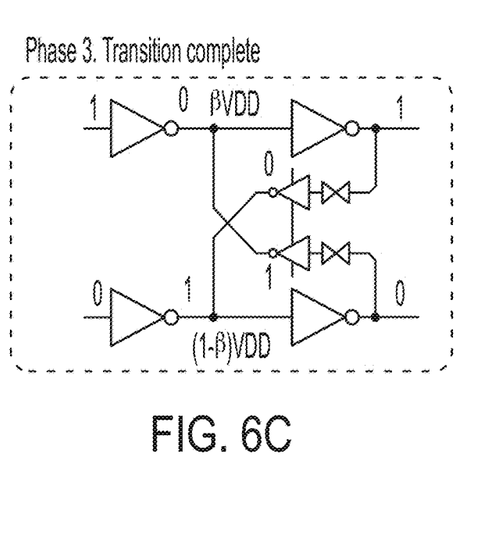

FIGS. 6A-6C illustrate a sequence of how the circuit of FIG. 5A transitions from a 0 to a 1, in accordance with some embodiments. Initially, as shown in FIG. 6A, a 0 is provided as input to inverter $106_1$ and a 1 is provided as input to inverter $106_3$. The output of inverter $106_1$ is $(1-\beta)V_{DD}$, where the value of $\beta$ depends upon the voltages with which the header and footer transistors are biased. The outputs of inverters $106_2$ and $106_4$, respectively, are 0 and 1.

As the inputs transition from 0 to 1 (upper line) and 1 to 0 (lower line), as shown in FIG. 6B, the output of inverter $106_1$ decreases and the output of inverter $106_3$ increases. The slope with which these signals increase and decrease depends upon the time constants of the data paths. During the transitions, the output impedance of the feedback equalizers (see, e.g., terminal $D_{IN}$ of FIG. 5B) places parallel impedances at the outputs of inverters $106_1$ and $106_3$, much like parallel resistor $R_0$ in FIG. 3B. As described above in connection with FIG. 3B, the result is a reduction in the time constant of the lines.

Finally, at FIG. 6C, the circuit has completed the transition and the outputs of inverters $106_2$ and $106_4$ are 1 and 0, respectively.

Figure 7A:
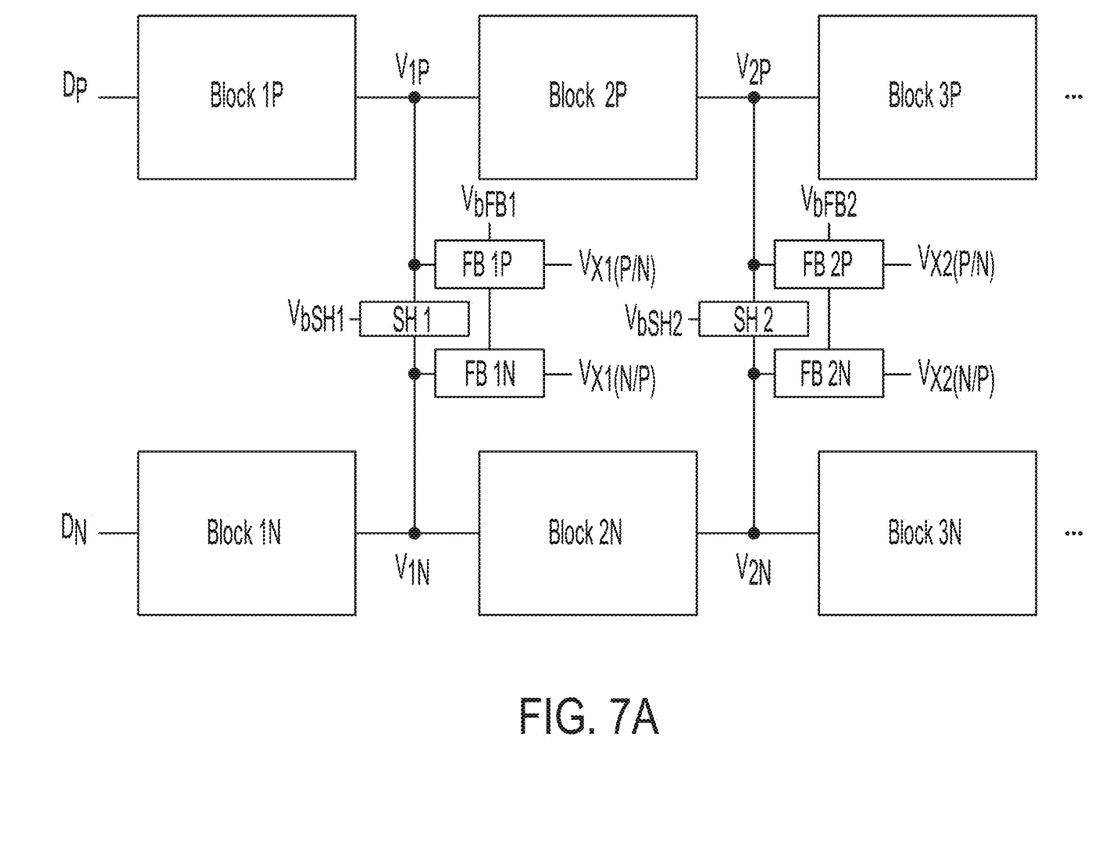
FIG. 7A is a block diagram illustrating a data path having shunt device and feedback equalizers, in accordance with some embodiments.

FIG. 7A is a block diagram illustrating a data path incorporating shunt devices and feedback equalizers, in accordance with some embodiments. The blocks labeled "Block 1P," "Block 1N," "Block 2P," "Block 2N," "Block 3P" and "Block 3N" may include inverters (see, e.g., inverters 106 of FIG. 4A or FIG. 5A), buffers, amplifiers, or other suitable types of circuits. The blocks labeled "SH 1" and "SH 2" represent shunt devices, an example of which is shown in FIG. 4A. Shunt device SH 1 is disposed between the nodes $V_{1p}$ and $V_{1n}$, and receives as input voltage $V_{bSH1}$. Shunt device SH 2 is disposed between the nodes $V_{2p}$ and $V_{2n}$, and receives as input voltage $V_{bSH2}$. Voltage $V_{bSH1}$ may represent, collectively, voltages $V_{bp2}$ and $V_{bn2}$ of FIG. 4A. Similarly, voltage $V_{bSH2}$ may represent, collectively, voltages $V_{bp2}$ and $V_{bn2}$ of FIG. 4A. The blocks labeled "FB 1P," "FB 1N," "FB 2P" and "FB 2N" represent feedback equalizers, examples of which are shown in FIG. 5A-5B. The feedback equalizers of the first stage receive voltage $V_{bFB1}$ and the feedback equalizers of the second stage receive voltage $V_{bFB2}$. Voltage $V_{bFB1}$ may represent, collectively, $V_{bp}$ and $V_{bn}$ of FIG. 5C. Similarly, voltage $V_{bFB2}$ may represent, collectively, $V_{bp}$ and $V_{bn}$ of FIG. 5C.

Figure 7B:
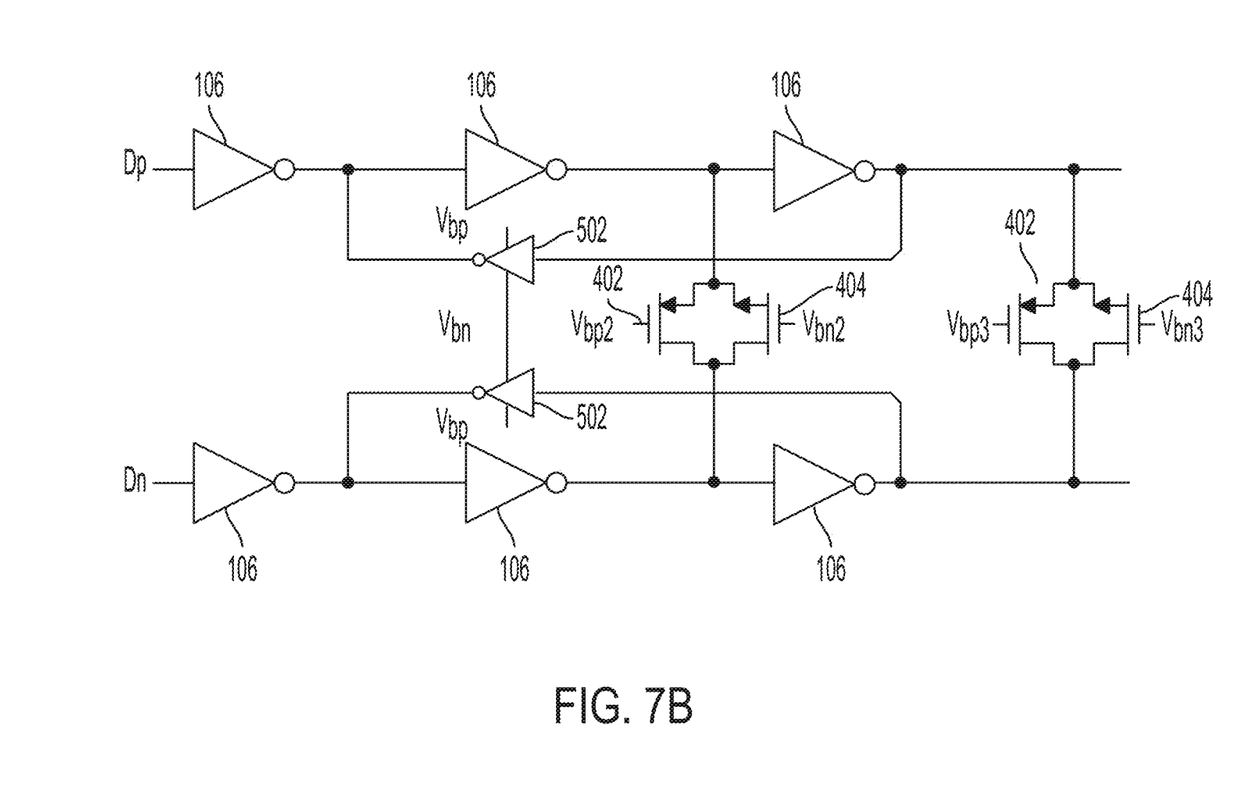
FIG. 7B illustrates a specific implementation of the system of FIG. 7B, in accordance with some embodiments.

A specific implementation of the block diagram of FIG. 7A is illustrated in FIG. 7B, in accordance with some embodiments. The data path of FIG. 7B includes inverters 106, shunt devices having pairs of transistors 402 and 404, and feedback equalizers 502.

Figure 7C:
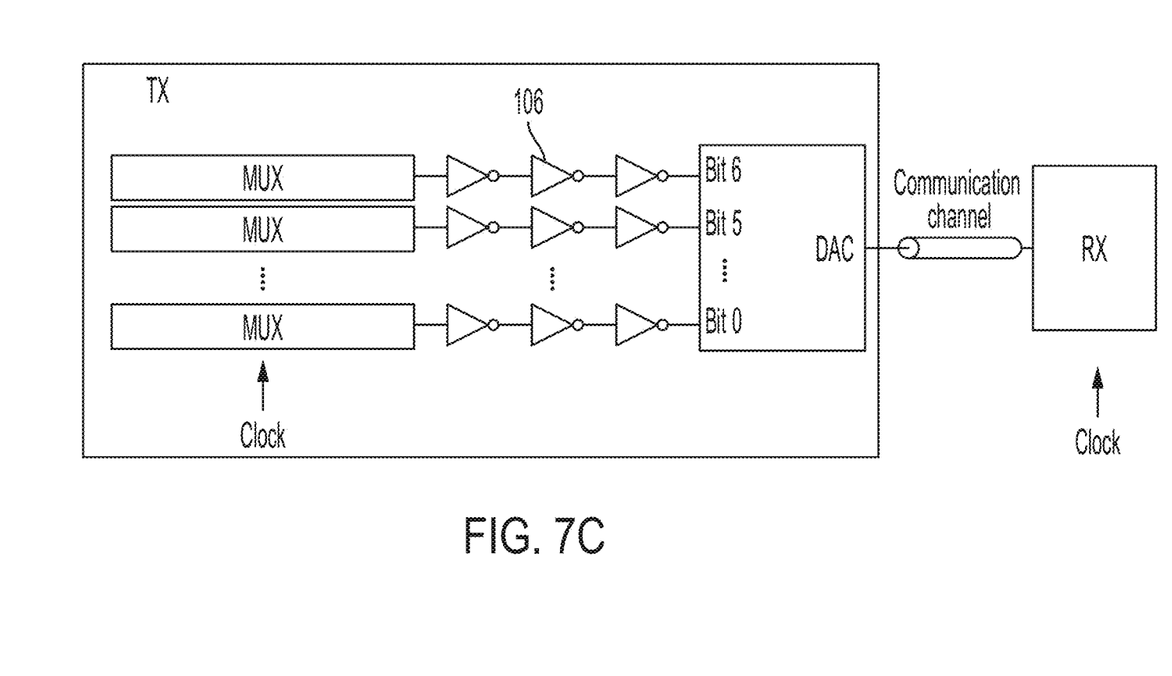
FIG. 7C illustrates a communication link having a transmitter and a receiver, in accordance with some embodiments.

Data paths of the types described herein may be implemented in a variety of contexts for transferring data from a source to a destination. On specific context is depicted in FIG. 7C, and relates to the data path leading to a DAC. In this example, the source includes multiplexers and the destination includes a n-bit DAC, where n=7 (though, n may have other values). The multiplexers, the data paths and the DAC are part of a same chip labelled in FIG. 7C as a "TX" (transmitter). The transmitter is in communication with a receiver ("RX") via a communication channel (e.g., a trace on a printed circuit board, a wire or a cable). The communication channel may be off-chip if the transmitter and the receiver are on separate chips, or on-chip if the transmitter and the receiver are on the same chip. The data paths may include shunt devices (as shown for example in FIG. 4A), feedback equalizers (as shown for example in FIG. 5A) or both (as shown for example in FIG. 7A).

Figure 8:
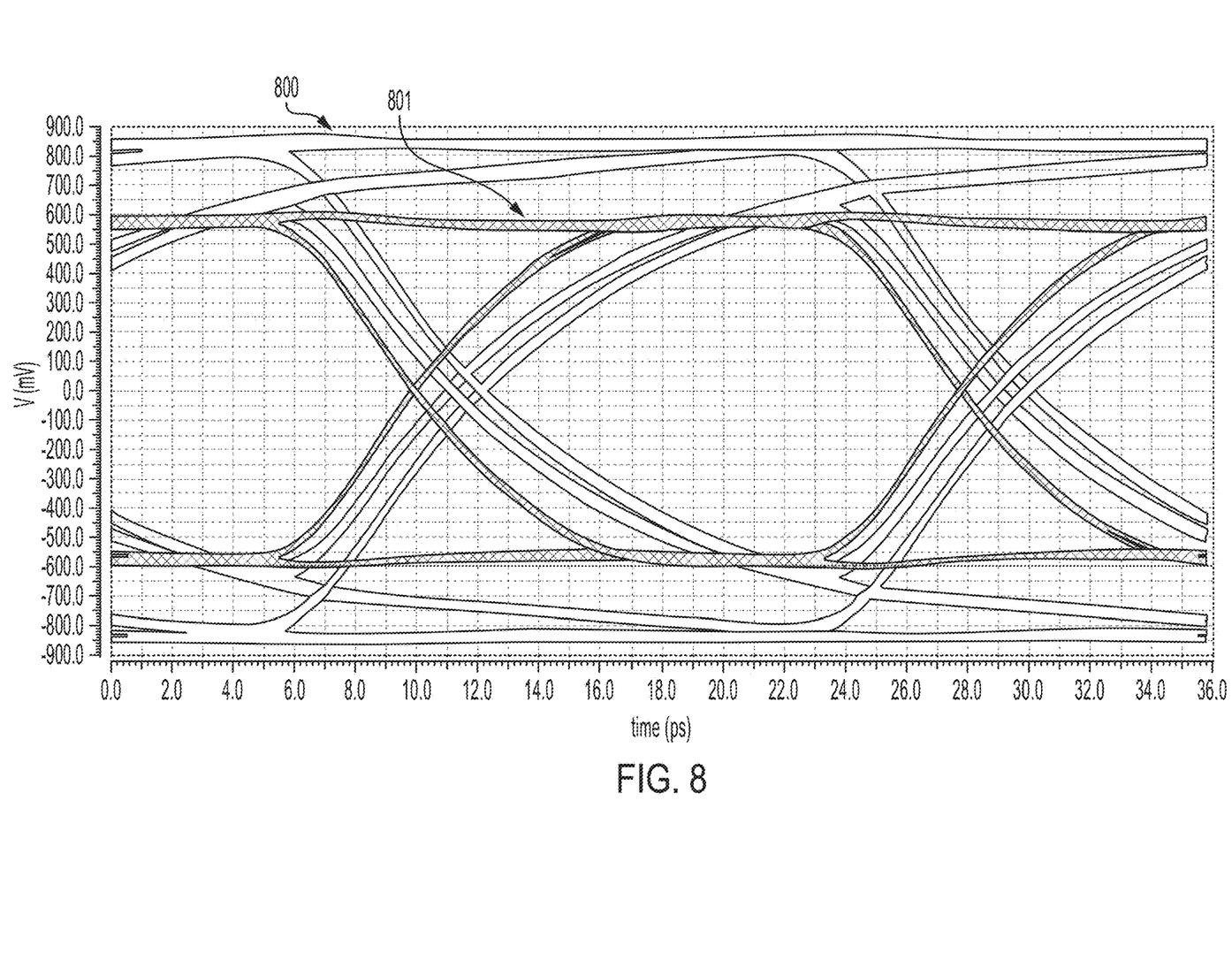
FIG. 8 is an eye diagram associated with the electronic communication system of FIG. 5A.

FIG. 8 shows a comparison between the eye diagram of the circuit of FIG. 1A (800) and the circuit of FIG. 5A (801). In the eye diagram 800, the voltage rails are 0 and $V_{DD}$, while in the eye diagram 801, the voltages are clamped to $\beta V_{DD}$ and $(1-\beta)V_{DD}$, where $\beta=0.14$ in this example. For the reasons described above in connection with FIG. 1D, the eye diagram 800 exhibits multiple trajectories that are substantially different from each other, resulting in a significant ISI. By contrast, the trajectories of the eye diagram 801 match more closely, resulting in a significant reduction of the ISI.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

The terms "approximately", "substantially," and "about" may be used to mean within ±20% of a target value in some embodiments, within ±10% of a target value in some embodiments, within ±5% of a target value in some embodiments, and within ±2% of a target value in some embodiments. The terms "approximately" and "about" may include the target value.

What is claimed is:

1. A system for reducing pattern-dependent inter-symbol interference (ISI), the system comprising:
    a chip comprising:
        a source including a multiplexer;
        a destination comprising an digital-to-analog converter (DAC); and
        a circuit disposed along a data path from the multiplexer to the DAC, the circuit being configured to:
            receive a supply voltage;
            receive an input signal from the DAC, and
            produce an output signal based on the input signal, wherein producing the output signal comprises clamping the output signal to a voltage that is a fraction of the supply voltage.

2. The system of claim 1, wherein the circuit is further configured to decrease a transition time of the output signal from a first value to the voltage by introducing a parallel resistance along the data path during at least a portion of the transition time.

3. The system of claim 1, wherein the source is configured to transmit data to the destination at a data rate greater than 56 Gb/s.

4. The system of claim 1, wherein the circuit comprises a feedback equalizer.

5. The system of claim 4, wherein the feedback equalizer comprises first and second open-loop buffers and first and second feedback buffers, the first feedback buffer being coupled between an input of the first open-loop buffer and an output of the second open-loop buffer and second feedback buffer being coupled between an input of the second open-loop buffer and an output of the first open-loop buffer.

6. The system of claim 5, wherein the first feedback buffer comprises a header transistor, a footer transistor, and an inverter disposed between the header transistor and the footer transistor.

7. The system of claim 1, wherein the circuit comprises a shunt device.

8. The system of claim 7, wherein the shunt device comprises first and second buffers and one or more transistors connecting an output of the first buffer to an output of the second buffer.

9. The system of claim 1, wherein the circuit comprises one or more complementary metal-oxide-semiconductor (CMOS) transistors.

10. A circuit disposed along a data path between a source to a destination, the circuit comprising:
one or more complementary metal-oxide-semiconductor (CMOS) transistors;
wherein the circuit is configured to:
receive a supply voltage;
receive an input signal from the source, and
produce an output signal based on the input signal, wherein producing the output signal comprises clamping the output signal to a voltage that is a fraction of the supply voltage.

11. The circuit of claim 10, wherein the circuit comprises a feedback equalizer comprising the one or more CMOS transistors.

12. The circuit of claim 11, wherein the feedback equalizer comprises first and second open-loop buffers and first and second feedback buffers, the first feedback buffer being coupled between an input of the first open-loop buffer and an output of the second open-loop buffer and second feedback buffer being coupled between an input of the second open-loop buffer and an output of the first open-loop buffer.

13. The circuit of claim 12, wherein the first feedback buffer comprises a header transistor, a footer transistor, and a CMOS inverter disposed between the header transistor and the footer transistor.

14. The circuit of claim 10, wherein the circuit comprises a shunt device.

15. The circuit of claim 14, wherein the shunt device comprises first and second buffers and the one or more CMOS transistors connect an output of the first buffer to an output of the second buffer.

16. A method comprising:
transmitting an input signal from a source to a destination with a data rate greater than 56 Gb/s; and
enabling transmission of the input signal from the source to the destination with a circuit disposed between the source and the destination, wherein the enabling comprises:
receiving a supply voltage;
receiving the input signal from the source; and
producing an output signal based on the input signal, wherein producing the output signal comprises clamping the output signal to a voltage that is a fraction of the supply voltage.

17. The method of claim 16, further comprising decreasing a transition time of the input signal from a first value to the voltage by introducing a parallel resistance along a data path positioned between the source and the destination during at least a portion of the transition time.

18. The method of claim 17, wherein introducing a parallel resistance along the data path comprises allowing a complementary metal-oxide-semiconductor (CMOS) inverter to transition from a first state to a second state.

19. The method of claim 16, wherein the fraction is between 0.5 and 1.

20. The method of claim 16, wherein the source and the destination are on a same chip.

* * * * *